United States Patent [19]

Fukuda et al.

[11] Patent Number: 5,550,091

[45] Date of Patent: Aug. 27, 1996

[54] METHOD OF SPUTTERING A SILICON NITRIDE FILM

[75] Inventors: Koichi Fukuda; Tomofumi Oba; Masanori Miyazaki, all of Sendai; Hirofumi Fukui, Daiwa-machi; Chisato Iwasaki, Sendai; Yasuhiko Kasama, Sendai; Tadahiro Ohmi, 2-1-17-301 Komegafukuro, Aoba-ku, Sandai-shi, Miyagi-ken; Masaru Kubota, Miyagi-ken; Hitoshi Kitagawa, Sendai; Akira Nakano, Furukawa; Osamu Yoshida, Sendai, all of Japan

[73] Assignees: Frontec Incorporated; Tadahiro Ohmi, both of Sendai, Japan

[21] Appl. No.: 437,606

[22] Filed: May 9, 1995

Related U.S. Application Data

[62] Division of Ser. No. 274,946, Jul. 14, 1994.

[30] Foreign Application Priority Data

| Jul. 14, 1993 | [JP] | Japan | 5-196866 |
| Dec. 21, 1993 | [JP] | Japan | 5-346625 |
| Mar. 7, 1994 | [JP] | Japan | 6-35767 |

[51] Int. Cl.$^6$ .................. H01L 21/318; C23C 14/06
[52] U.S. Cl. ............... 437/241; 437/40; 437/41; 204/192.23
[58] Field of Search ............... 437/241, 40, 41; 204/192.23

[56] References Cited

U.S. PATENT DOCUMENTS

| 4,704,623 | 11/1987 | Piper et al. | 357/23.7 |
| 4,948,482 | 8/1990 | Kobayashi et al. | 204/192.23 |
| 5,036,370 | 7/1991 | Miyago et al. | 357/4 |
| 5,041,888 | 8/1991 | Possin et al. | 357/23.7 |
| 5,334,859 | 8/1994 | Matsuda | 257/57 |

FOREIGN PATENT DOCUMENTS

| 0570928A1 | 5/1993 | European Pat. Off. . | |
| 59-115561 | 7/1984 | Japan . | |
| 1275745 | 4/1988 | Japan | 204/192.23 |
| 3-46231 | 2/1991 | Japan . | |
| 480928 | 3/1992 | Japan | 204/192.23 |

OTHER PUBLICATIONS

*Plasma-Enhanced Chemical Vapor Deposition of Silicon Nitride*, Jpn. J. Appl. Phys. vol. 31 (1992) pp. 336–342, Part 1, No. 2A, Feb. 1992 Ikunori Kobayashi, Tetsu Ogawa and Sadayoshi Hotta.

Primary Examiner—R. Bruce Breneman
Assistant Examiner—Matthew Whipple
Attorney, Agent, or Firm—Guy W. Shoup; Patrick T. Bever

[57] ABSTRACT

There is provided an electronic device like a TFT using a silicon nitride insulating film of a single layer structure having an excellent dielectric voltage, and a method of producing the electronic device with reliability. In the electronic device, a conductive wiring pattern is deposited on a surface of an electrically insulated substrate, and an insulating layer is formed to cover the wiring pattern and the substrate. The insulating layer is made of a silicon nitride insulating film. A contact angle θ between the wiring pattern and the substrate is equals 60° or more, and a value Tn1/Tg of a thickness Tn1 of the silicon nitride insulating film and a thickness Tg of the wiring pattern equals 2 or more. A horizontal distance Tn2 between a rise start position, where the silicon nitride film rises because of a step of the wiring pattern and the top end of the wiring pattern, and Tn1 are in a relation where 0.6≦Tn2/Tn1.

2 Claims, 11 Drawing Sheets

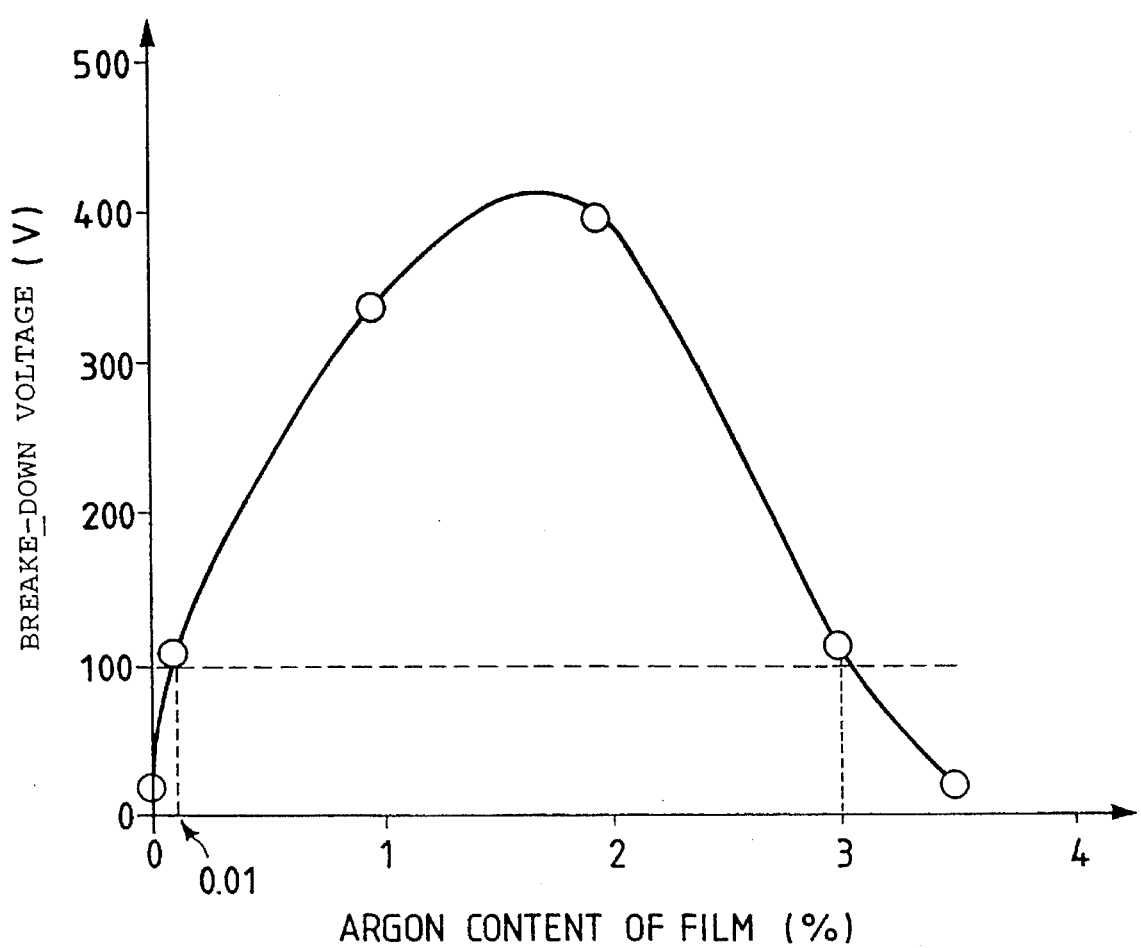

METHOD OF SPUTTERING A SILICON NITRIDE FILM

This application is a division of application Ser. No. 08/274,946, filed Jul. 14, 1994.

BACKGROUND OF THE INVENTION

1. Field of the Invention

The present invention relates to an electronic device and a method of producing the device, and more particularly, to an electronic device in which a silicon nitride insulating film is laid on a conductive member formed on the surface of an insulating substrate, and a method of producing the device.

2. Description of the Related Art

As an example of a conventional electronic device, a thin-film transistor (referred to as a TFT hereinafter) used to drive an active matrix liquid crystal display device shown in FIG. 5 will be described.

FIG. 6 is a sectional view taken along line A–A' shown in FIG. 5 and conceptually illustrates a TFT array. Since FIG. 6 is a conceptual view, the dimensions therein are different from those of an actual device.

Referring to FIG. 6, numerals 9 and 10 respectively denote a gate electrode (wiring pattern) and a gate wire (wiring pattern) patterned on a substrate 5. An insulating film 3 includes a gate insulating film 3a and an interlayer insulating film 3b at the intersection of wires.

Numerals 11, 12 and 13 respectively denote a source electrode, a source wire and a drain electrode.

A silicon nitride thin film is frequently used as the gate insulating film 3a and the interlayer insulating film 3b at the intersection of multilevel metal wires of the TFT array.

In a desirable composition of the silicon nitride thin film, the element ratio of silicon to nitrogen is approximately 3 to 4 and a trace quantity of hydrogen is contained therein to stabilize the quality thereof. Such insulating layer is mainly formed in plasma enhanced chemical vapor deposition (referred to as PECV-D hereinafter). As a material gas, silane-nitrogen, silane-ammonia-nitrogen, silane-ammonia-hydrogen, silane-nitrogen-hydrogen, and silane-ammonia-nitrogen-hydrogen gases are normally used.

However, in an electronic device like such TFT using silicon nitride insulating films as the gate insulating film 3a and the interlayer insulating film 3b at the intersection of multilevel wires, an electrical short circuit sometimes occurs between the gate electrode 9, the gate wire 10 and wires formed through the insulating film (the source wire 12, the source electrode 11 and so on). More particularly, the probability such short circuit will occur is very high in a highly integrated or large-area substrate. Such short circuit may occur during use or the production process of an ultimate product. If the short circuit occurs during use of the ultimate product, the reliability of the product is lowered. Furthermore, a short circuit occurring during the production process lowers the yield. For example, dielectric breakdown sometimes occurs between the source wire 12 and the gate wire 10 or the gate electrode 9 during a photoresist process for forming contact holes and so on after the formation of the source wire 12 and so on.

Considering that these problems result from the existence of pinholes in the insulating film, Japanese Laid-open Patent No. 58-190042 attempts to solve the problems by adopting a so-called multilayered insulating film structure in which a non-doped amorphous silicon layer is laid on the intersection of a gate wire and a source wire. However, since this technique is used on the assumption that the insulating layer will not have a single layer structure, but a multilayered insulating film structure, it is hard to avoid complication of the production process.

Accordingly, an electronic device such as a TFT of a single-layer structure which is excellent in the dielectric characteristics and capable of being easily produced is desired.

Particularly, since the electronic device is now frequently used in harsh environments, it is desired that the break-down voltage of the insulating film be more than 100 V. Furthermore, it is desirable from the viewpoint of miniaturization of the electronic device that the thickness of the insulating film be limited to less than 500 nm, preferably, 200 to 400 nm. Therefore, an electronic device having a thin insulating film, which has a thickness of approximately 200 nm and a break-down voltage of more than 100 V, is desired.

No electronic device which satisfies such desire has been developed up to now.

A silicon nitride thin film is frequently used as an insulating film in an electronic device, for example, an insulating film 103 at the intersection of multilevel metal wires of a TFT array used to drive an active matrix liquid crystal display device shown in FIGS. 12 and 13. Such film is mainly formed in the PECV-D method, and silane-nitrogen, silane-ammonia/nitrogen, silane-ammonia-hydrogen, silane-nitrogen-hydrogen and silane-ammonia-nitrogen-hydrogen gases are well known as a material gas of the film. The film is deposited at a temperature of more than 300° C. to stabilize the quality thereof. This temperature is several tens of degrees higher than the temperature at which an amorphous silicon layer frequently used in the electronic device is formed. When a similar insulating film is formed in sputtering, argon of more than 0.50 Pa is put into an atmosphere.

However, the silicon nitride thin film formed in the PECV-D or sputtering method using the above mixed gas has more pinholes and lower break-down voltage than an oxidized film formed by high temperature oxidization of silicon. Even if the silicon nitride thin film is used in an electronic device, the single layer structure of the film makes it difficult to obtain the necessary break-down voltage. Therefore, in the TFT array shown in FIGS. 12 and 13, the necessary break-down voltage is obtained from a multilayered film formed by adding another film at the intersection of the multilevel metal wires. This complicates the structure and production process of the film.

Furthermore, since the temperature for depositing an insulating film in the PECV-D method is high, many foreign particles are generated from the inner wall of a film forming device in the forming operation, and these sometimes have a bad influence on the quality of the film.

Still furthermore, in an electronic device such as a TFT having an amorphous silicon film in direct contact with an insulating film, since the insulating film and the amorphous silicon film are different in film depositing temperature, it is necessary to increase or decrease the temperature of a substrate so as to achieve the depositing temperature of one of the films after forming the other film, and such adjustment of temperature takes a long time.

SUMMARY OF THE INVENTION

It is an object of the present invention to provide an electronic device like a TFT including a thin insulating film of a single layer structure which is approximately 0.2 µm in thickness and has an excellent break-down voltage more than 100 V, and a method of producing the electronic device with efficiency and reliability.

In order to achieve the above object, according to a first aspect of the present invention, there is provided an electronic device having a conductive wiring pattern formed on a surface of a substrate, at least the surface being electrically insulated, and an insulating layer formed to cover the substrate and the wiring pattern partly or wholly, in which the insulating layer is made of a silicon nitride insulating film, a contact angle θ between the wiring pattern and the substrate equals 60° or more, a value Tn1/Tg of a thickness Tn1 of the silicon nitride insulating film and a thickness Tg of the wiring pattern equals 2 or more, and Tn1 and a horizontal distance Tn2 between a rise start position where the silicon nitride insulating film rises because of a step of the wiring pattern and the top portion of the wiring pattern is in a relation $0.6 \leq Tn2/Tn1$.

According to a second aspect of the present invention, in an electronic device provided with a conductive wiring pattern formed on a surface of a substrate, at least the surface being electrically insulated, and an insulating layer formed to cover the substrate and the wiring pattern partly or wholly, main components of the insulating film are silicon and nitrogen, the element ratio of the silicon to the nitrogen is approximately 3:4, and the content of a rare gas element in the insulating film is within a range of 0.01 atm % to 3 atm %.

According to a third aspect of the present invention, the electronic device in the second aspect is a thin film transistor.

According to a fourth aspect of the present invention, the rare gas element is argon in the electronic device in the second or third aspect.

According to a fifth aspect of the present invention, there is provided a method of producing an electronic device provided with a conductive wiring pattern formed on a surface of a substrate, at least the surface being electrically insulated, and an insulating layer formed to cover the substrate and the wiring pattern partly or wholly, in which a gas for forming the insulating film in PECV-D is a mixed gas containing at least silane, ammonia, nitrogen and a rare gas element, and the mole ratio of the rare gas element/nitrogen is within a range of 0.1 to 10.

According to a sixth aspect of the present invention, the insulating film is formed at a temperature ranging from 220° C. to 280° C. in the method of the fifth aspect.

According to a seventh aspect of the present invention, in the method of the fifth or sixth aspect, the electronic device has an amorphous silicon film in direct contact with the insulating film, and the insulating film and the amorphous silicon film are deposited at almost the same temperature.

According to an eighth aspect of the present invention, there is provided a method of producing an electronic device provided with a conductive wiring pattern formed on a surface of a substrate, at least the surface being electrically insulated, and an insulating film mainly composed of silicon and nitrogen and formed to cover the substrate and the wiring pattern partly or wholly, in which a target for forming the insulating film in sputtering contains at least silicon, an atmospheric gas for the sputtering is a mixture of at least a rare gas element gas, a hydrogen gas and a nitrogen gas or an ammonia gas, the partial pressures of the rare gas element gas and the hydrogen gas are respectively 0.20 Pa to 0.40 Pa and 0.02 Pa to 0.15 Pa.

According to a ninth aspect of the present invention, in the method of one of the fifth to eighth aspects, the rare gas element is argon.

The operation of the present invention will now be described based on our knowledge obtained in working on the present invention.

The inventor of the present invention reviewed a conventional electronic device.

Many causes of lowering of the break-down voltage of the electronic device can be thought of, for example, the thickness, quality and so on of a silicon nitride insulating film.

The inventor thought that the quality of the silicon nitride insulating film was a main cause of lowering the dielectric voltage. Japanese Laid-open Patent Application No. 58-190042 said that pinholes in the insulating film had a bad influence on the break-down voltage. In order to confirm whether such pinholes were the only cause of lowering the break-down voltage, the inventor formed a nitride film in which the number of pinholes were reduced. In other words, a silicon nitride insulating film was formed in PECV-D while controlling the substrate temperature, the RF electric power, the composition of a material gas and so on, the presence of pinholes was checked, and a silicon nitride insulating film containing few pinholes was obtained. However, even the thus formed silicon nitride insulating film having few pinholes could not ensure a sufficient dielectric voltage.

Then, experiments were further conducted repeatedly to examine under what conditions the break-down voltage was lowered. The results of the examination revealed that the angle between a wiring pattern and a substrate (contact angle: θ in FIG. 1) was one factor. In other words, for example, in a case of a gate wire in a TFT used to drive a liquid crystal display device, the leak characteristic was relatively good when the contact angle θ was less than 60°, while the probability the break-down voltage would be lowered was increased rapidly when θ exceeded 60°. However, since the break-down voltage was not so bad in some cases even if θ exceeded 60°, various kinds of experiments were conducted for further study on a condition in which θ was more than 60°.

First, the break-down voltage was measured while changing the thickness of the insulating film in order to examine the influence of the film thickness. From a common sense standpoint, the break-down voltage of a thicker insulating film without any pinholes are better than that of a thinner one. Statistics of measurement results of many samples showed that the break-down voltage of the thicker insulating film was indeed better than that of the thinner film. However, contrary to expectations, even the thick film was inferior to the thin film in break-down voltage in some cases.

In order to put renewed focus on the sample films each having a low break-down voltage, etching was conducted on the sample films. As a result of etching, the etching speed in a region between a rise start position (A in FIG. 1) where the film rises because of a step of an electrode and a corner portion (B or C in FIG. 1) of the electrode is extraordinarily higher than that of other portions.

As shown in FIG. 6, an insulating film 3 is exposed to an etchant in some step during the production of the electronic device. The inventor concluded that etching was selectively conducted from the above-mentioned rise start position toward the corner portion of the electrode when the insulating film 3 is exposed to the etchant and that such etching was a main cause of lowering the break-down voltage.

Furthermore, the inventor conceived that the generation of such region subject to be etched might depend on the rise start position, and developed another film depositing method capable of controlling the rise start position. Tests carried out in this method while changing the rise start position revealed that the break-down voltage was remarkably increased when 0.6≦Tn2/Tn1 even if 60°≦θ and that a break-down voltage of more than 100 V could be obtained even if the insulating film was less than 200 nm in thickness and had a single layer structure. These findings led to the present invention.

According to the second aspect of the present invention, the break-down voltage of a silicon nitride thin film as an insulating film is greatly improved and the break-down voltage of an electronic device using the insulating film is also improved. Preferable characteristics can be obtained when a rare gas element, though an unwelcome impurity in itself, is contained, even if by a small amount within a fixed range. Though that reason has not been clarified, it can be supposed that the insulating film is stabilized by a kind of wedge effect caused by the injection of an appropriate amount of a more inactive and stable element than silicon and nitrogen. On the other hand, it can be also supposed that an excellent characteristics of silicon nitride are diminished and the break-down voltage is lowered when the amount of the rare gas element is excessive.

According to the third aspect, since the electronic device is a TFT, the above insulating film functions as a gate insulating film and an insulating film at the intersection of multilevel wires in the TFT. Therefore, the characteristics of the insulating film on a gate electrode of the TFT are stabilized, and the gate voltage and the break-down voltage between the multilevel wires are increased.

According to the fourth aspect, argon, which can be less expensive and be obtained more stably compared with other rare gas elements, is used as a rare gas element. Therefore, the present invention according to the second or third aspect can be carried out inexpensively and stably. This is extremely effective from an industrial point of view.

According to the fifth aspect, when an electronic device is produced with forming an insulation film mainly composed of silicon and nitrogen in PECV-D nitrogen and a rare gas element are used as a dilution gas for depositing the insulating film. Since the mixing ratio of nitrogen and the rare gas element is in a relation where the rare gas element/nitrogen=0.1 to 10, a predetermined amount of rare gas element can be injected into the insulating film, and therefore, the break-down voltage of the electronic device can be increased.

Since the ionization characteristic of the rare gas element gas, representing the aptness to ionize, is different from that of nitrogen, the composition of the mixed gas is controlled by adding the rare gas element into the dilution gas, thereby independently controlling the plasma density and the potential of plasma during the PECV-D film formation. According to tests carried out by the inventor of the present invention, when the nitrogen content of the dilution gas is increased, the potential of plasma is also increased. In other words, though a proper nitrogen content makes it possible to obtain a dense and high-quality insulating film, an excessive nitrogen content causes damage to the film being formed. On the other hand, the composition of the rare gas element is related to the control of the plasma density. When the content of the rare gas element is small, the distribution of the plasma density is good, but the density is low. To the contrary, the content of the rare gas element is excessive, the distribution of the plasma density is not preferable, and abnormal discharge is liable to occur at the end of the substrate.

Therefore, the composition ratio of nitrogen and the rare gas element in the dilution gas has an optimal range. In a composition range according to the fifth aspect of the present invention, a dense and high-quality insulating film having a high break-down voltage can be obtained without damaging the film during the process and causing abnormal discharge.

According to the sixth aspect, since the temperature for depositing the insulating film is low, 220° C. to 280° C., the number of foreign particles generated from the inner wall of a film forming apparatus during film deposition is reduced.

According to the seventh aspect, since the insulating film and the amorphous silicon film are deposited at almost the same temperature, one of the films can be deposited immediately after depositing the other film, without cooling or heating the substrate. In short, a process for adjusting the temperature of the substrate does not need so long a time.

According to the eighth aspect, a predetermined amount of rare gas element to be injected is smaller than that of a conventional insulating film deposited in sputtering, and the structure of the film is stabilized. Therefore, the break-down voltage of the electronic device is increased. Furthermore, since an appropriate amount of hydrogen gas is contained, hydrogen atoms are connected to dangling bonds of silicon atoms in the deposited film, defects in the film are reduced, and the break-down voltage of the electronic device is increased.

Still furthermore, since a silicon crystal or a sintered compound of silicon nitride is used as a target, it is unnecessary to use a dangerous silane gas which is required to be treated carefully.

According to the ninth aspect, since argon, which is less expensive and capable of being obtained more stably than other rare gas elements, is used as a rare gas element, the present invention according to one of the fifth to eighth aspects can be carried out inexpensively and stably. This is extremely effective from an industrial point of view.

BRIEF DESCRIPTION OF THE DRAWINGS

FIG. 7 is a graph showing a relationship between the content of argon and the break-down voltage of an insulating film used in another embodiment;

DESCRIPTION OF THE PREFERRED EMBODIMENTS

Figure 1:
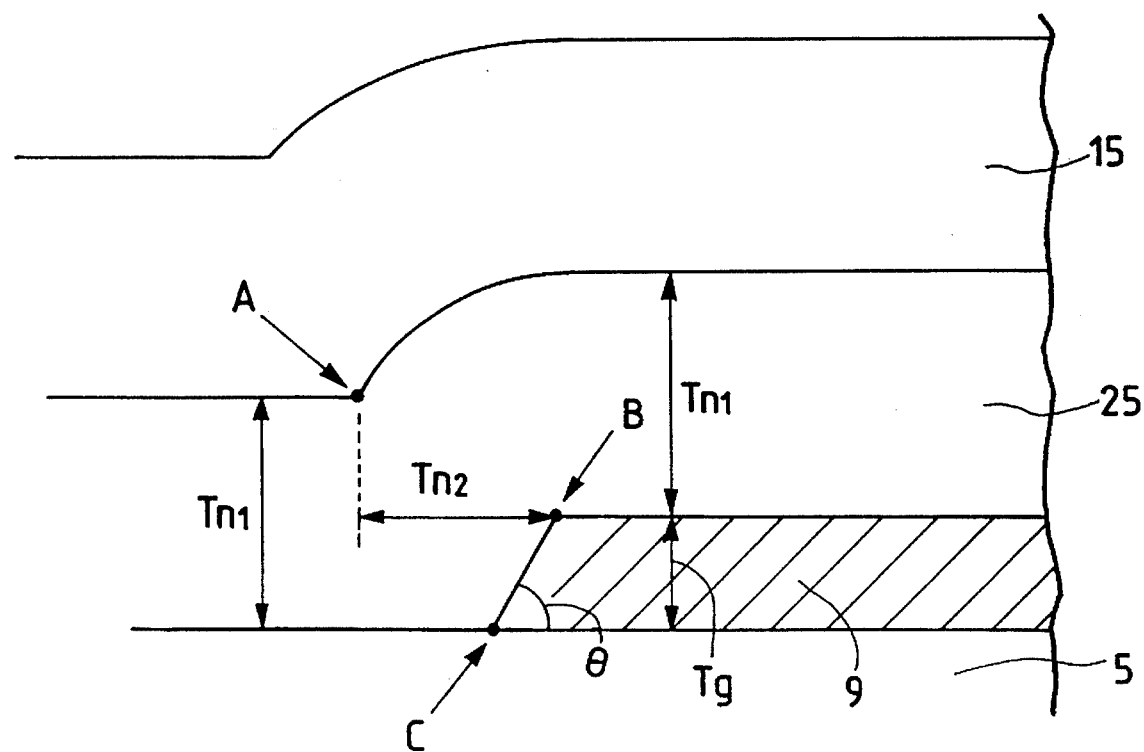
FIG. 1 is an enlarged conceptual sectional view showing the vicinity of a wiring pattern.

The construction of the present invention will now be divisionally described with reference to embodiments.
[Electronic Device]

In an electronic device according to the present invention, a conductive wiring pattern is formed on a surface of a substrate in which at least the surface is electrically insulated, and a silicon nitride insulating film covers the substrate and the wiring pattern partly or wholly. Such electronic device is, for example, a TFT device, a capacitative element, a light emitting element, a photosensor, a solar battery and so on.

It is only necessary that at least the surface of the substrate is electrically insulated. A substrate which is insulated itself (e.g. a ceramic substrate like glass) may be used as it is, or an insulating film (e.g. a $SiO_2$ film, a $Si_3N_4$ film) may be formed on the surface of a conductive or semiconductive substrate. Either of the above ways may be appropriately selected according to the type of the electronic device.

Though the present invention is effective particularly when the insulating film has a single layer structure, the break-down voltage thereof is increased in a multilayered insulating film, and this case is also included in the scope of the present invention.

A material of the conductive pattern is not specially limited, and, for example, Cr, Al, Cu or the like, or an alloy of the metals is properly selected. A preferable width of the wiring pattern at a gate electrode is less than 10 μm, a more preferable one is less than 7 μm, and the most preferable one is 5 μm. A preferable thickness of the pattern is 100 nm to 200 nm. The thickness in this range makes it possible to decrease the height of steps on the surface of an alignment film on a TFT array and to improve the display performance of a LCD.

In the present invention, a contact angle θ which the wiring pattern forms with the surface of the substrate is set at more than 60°.

If a silicon nitride insulating film covers the wiring pattern at a contact angle of less than 60, the break-down voltage between electrodes is increased. However, a special etching process is required to achieve such contact angle.

Furthermore, it is necessary in the case of the contact angle of less than 60° to make either the width or thickness of the electrode excessively larger. Though a cross section area larger than a predetermined one is needed to prevent heat generation of the electrode or the wire, the width or thickness of the electrode must be increased to make up for cut portions in the case of the contact angle of less than 60°.

Excessive increase of the width or thickness of the electrode opposes the desire to miniaturize the electronic device, particularly, the desire that the thickness of an electrode (wire) in a TFT used to drive a liquid crystal display device be less than 7 μm in order to decrease the area in which extraneous light is shielded by the electrode.

Therefore, a contact angle of more than 60° is desired. However, when the contact angle is more than 60°, the isolation characteristics remarkably become worse. The present invention aims to solve this problem.

In order to make the contact angle more than 60°, for example, it is only necessary to perform anisotropic etching by wet or dry etching.

The step is inversely tapered (θ≧90°) in some etching, and the present invention applies to such case.
[0.6≦Tn2/Tn1]

The most characteristic point of the present invention is that a horizontal distance $T_{n2}$ between a rise start position, where the silicon nitride insulating film rises because of a step of the wiring pattern, and the top portion of the wiring pattern and a thickness $T_{n1}$ of the silicon nitride insulating film are in a relation where 0.6≦Tn2/Tn1.

This point will be described with reference to FIG. 1. FIG. 1 is an enlarged conceptual view of the vicinity of a wiring pattern. However, the dimensions therein are not precise.

Referring to FIG. 1, A denotes a rise start position in which a silicon nitride insulating film 25 rises because of a step of a wiring pattern (gate electrode) 9. On the other hand, the top portion of the wiring pattern 9 is denoted by B in the figure. In other words, the upper surface of the wiring pattern 9 starts to descend toward a substrate 5 at the position B. $T_{n2}$ denotes a horizontal distance between the rise start position A and the descend start position B.

When Tn2/Tn1 is more than 0.6, the dielectric characteristics are remarkably enhanced. Though the reason of the enhancement is not clear, the enhancement was confirmed from the result of an experiment in an embodiment described below.

In the case of film formation in PECV-D, Tn2/Tn1 can be controlled by appropriately changing the RF electric power, the gas composition and the temperature of the substrate. Therefore, conditions for controlling Tn2/Tn1 can be previously found in an experiment or the like while changing these values.

For example, when a silane-ammonia-Ar-$N_2$ gas is used as a material gas, the substrate temperature is approximately 250° C., the RF electric power is more than 400 W and the argon gas content is more than 25%, Tn2/Tn1 can exceed 0.6. It is needless to say that the value is also influenced by other gas components.
[2≧Tn1/Tg]

Tg denotes the thickness of the wiring pattern 9. In the present invention, Tn1/Tg equals 2 or more, and preferably, equals 4 or more.

Tn1/Tg is set at more than 2 because the increase of the break-down voltage is not noticed if less than 2.

Even if Tn1/Tg exceeds 4, since the increase of the break-down voltage per unit is brought to a standstill, Tn1/Tg less than 4 is desirable. To the contrary, when Tn1/Tg exceeds 4, the film thickness becomes too large, which is not preferable from the viewpoint of miniaturization of the electronic device.
[Thickness of Insulating Film]

In the present invention, a preferable thickness of the insulating film is less than 500 nm, and more preferably, 200 nm to 400 nm. It is a great characteristic that such a thin film having a thickness of 200 nm can have a break-down voltage of more than 100 V.

The present invention will now be described in detail according to embodiments. It is needless to say that the scope of the present invention is not limited to the following embodiments.

[Embodiment 1]

In this embodiment, the present invention is applied to the intersection of multilevel metal wires of a TFT in an active matrix liquid crystal display device.

Figure 2:
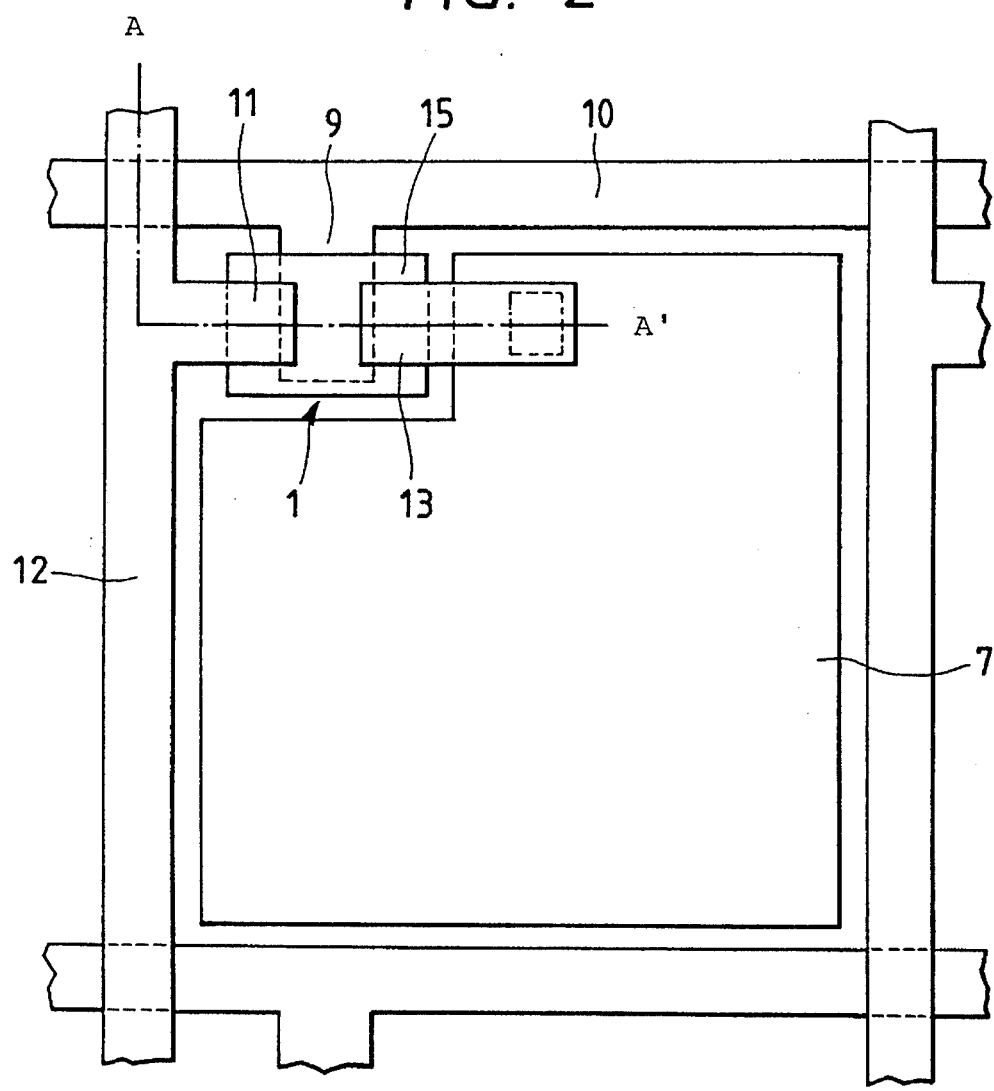
FIG. 2 is a plan view of a TFT produced in an embodiment.
Figure 3:
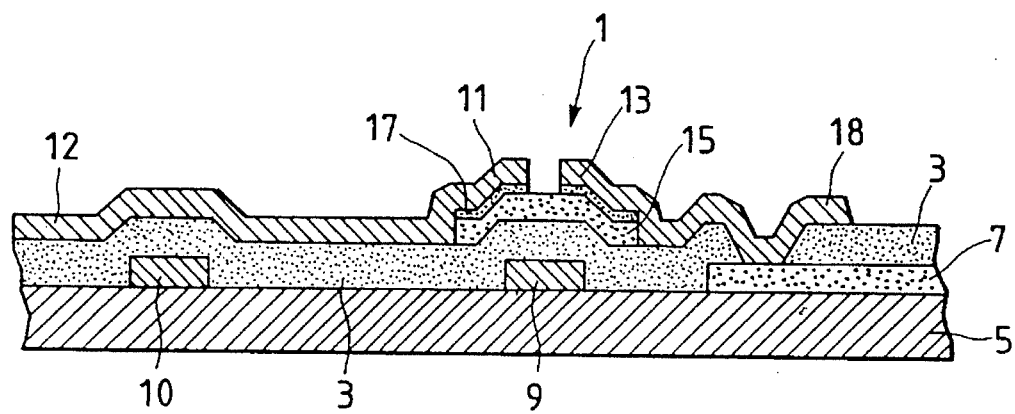
FIG. 3 is a sectional view taken along line A–A' in FIG. 2.

The TFT in this embodiment has an inverse stagger structure, and will be described with reference to FIGS. 2 and 3.

After a film of indium-tin oxide (ITO) was formed on the surface of a glass substrate (Corning #7059) 5 and patterning was conducted thereon, thereby forming a transparent electrode (ITO electrode) 7 functioning as a pixel electrode.

Then, a Cr film having a thickness of 100 nm was formed, and a gate wire 10 having a width of 3 μm and a gate electrode 9 having a width of 15 μm were formed by resist application, development and etching.

In the etching, the angle which the substrate 5 formed with the gate wire 10 or the gate electrode 9 was determined by controlling anisotropy of wet etching or dry etching. In this embodiment, the angle was set at approximately 90°.

Then, a silicon nitride insulating film was formed in PECV-D to cover the substrate 5, the gate electrode 9 and the gate wire 10. The silicon nitride insulating film functions as a gate insulating film and an interlayer insulating film of the TFT.

The conditions for forming the silicon nitride insulating film were as follows.

Film Depositing Apparatus: Parallel plate in-line type from Anelva

Injection Gas (sccm)

$SiH_4$: 50

$NH_3$: 150

$N_2$: 500

Ar: 500

Pressure: 150 Pa

Substrate Temperature: 250° C.

RF Electric Power: 700 W

Excitation Frequency: 13.56 MHz

Film Thickness: 300 nm

Then, a semiconductive layer (i: a-Si layer) made of amorphous silicon containing no impurities was deposited in a thickness of approximately 100 nm in a normal method, and an amorphous silicon layer 17 (n+:a-Si layer) having a thickness of approximately 20 nm, in which P was added, was laid as an ohmic contact layer in the same chamber. After the resist process, other parts of the amorphous silicon layer than a channel portion 15 of the TFT were removed by wet etching. An etchant containing hydrofluoric acid (HF) was used for the etching. The surface of the silicon nitride insulating film bared by removing the amorphous silicon film was exposed to the etchant during overetching, and therefore, slightly etched.

Then, contact holes were formed by dry etching on the transparent electrode (ITO) 7 after the resist process. Subsequently, a Cr film having a thickness of 300 nm was formed, and a source electrode 11, a source wire 1, a drain electrode 13 and a drain wire 18 were formed by patterning. In this embodiment, the source wire 12 was so designed as to cross the gate wire 10 as shown in FIG. 2. The drain wire 18 and the transparent electrode 7 were connected to each other through a contact hole formed in a proper position on the transparent electrode 7. The channel length and width of the TFT were respectively 7 μm and 12 μm.

[Evaluation]

The following items of the TFT device formed as described above were measured and various kinds of characteristics thereof were evaluated.

(Rise Start Position)

The rise start position was observed under a cross section transmission electron microscope (TEM).

$T_{n2}/T_{n1}$ was 1.0 in this embodiment.

(break-down voltage)

The break-down voltage was measured by applying voltage between the gate electrode and the drain electrode. The apparatus #4142B from Hewlett Packard was used for the measurement.

The measured isolation voltage was 243 V.

(Etching Characteristic)

After the insulating film was exposed by removing the drain wire and the source wire, etching was conducted on the insulating film. It was examined, by using a buffered hydrofluoric solution ($NH_4F$ 40% solution:HF 48% solution=10:1) what amount of etching caused cracks on the insulating film.

As a result of the examination, cracks arose on the insulating film after etching by 280 nm was performed.

(Other Characteristics)

Threshold Value 1.0 V

ON-state Current $1.5 \times 10^{-6}$ A

OFF-state Current $1.0 \times 10^{-15}$ A

[Embodiment 2]

In this embodiment, an experiment was conducted while changing $T_{n2}/T_{n1}$. Other conditions of the experiment were the same as those of Embodiment 1.

The conditions and the evaluation result of the experiment are shown in Table 1.

TABLE 1

| Film depositing condition Injection gas (sccm) | No. 1 | No. 2 | No. 3 | No. 4 | No. 5 | No. 6 |
|---|---|---|---|---|---|---|
| Silane | 50 | 50 | 50 | 50 | 50 | 50 |
| Ammonia | 150 | 150 | 150 | 150 | 150 | 150 |
| Nitrogen | 1000 | 900 | 754 | 600 | 500 | 500 |
| Argon | 0 | 100 | 250 | 400 | 500 | 500 |
| Pressure (Pa) | 150 | 150 | 150 | 150 | 150 | 150 |
| Excitation frequency (MHz) | 13.56 | 13.56 | 13.56 | 13.56 | 13.56 | 13.56 |
| RF power (W) | 300 | 400 | 400 | 450 | 500 | 600 |
| Substrate temperature (°C.) | 300 | 300 | 250 | 250 | 250 | 250 |
| Insulating film thickness (nm) | 300 | 300 | 300 | 300 | 300 | 300 |
| $T_{n2}/T_{n1}$ | 0.3 | 0.4 | 0.6 | 0.8 | 0.9 | 1.0 |
| Break-down voltage (V) | 60 | 62 | 153 | 225 | 237 | 240 |

In Table 1, Conditions Nos. 3 to 6 are used in this embodiment of the present invention, and Conditions Nos. 1 and 2 are samples for comparison.

Table 1 reveals that the break-down voltage increases rapidly when $T_{n2}/T_{n1}$ exceeds 0.6.

Figure 4:
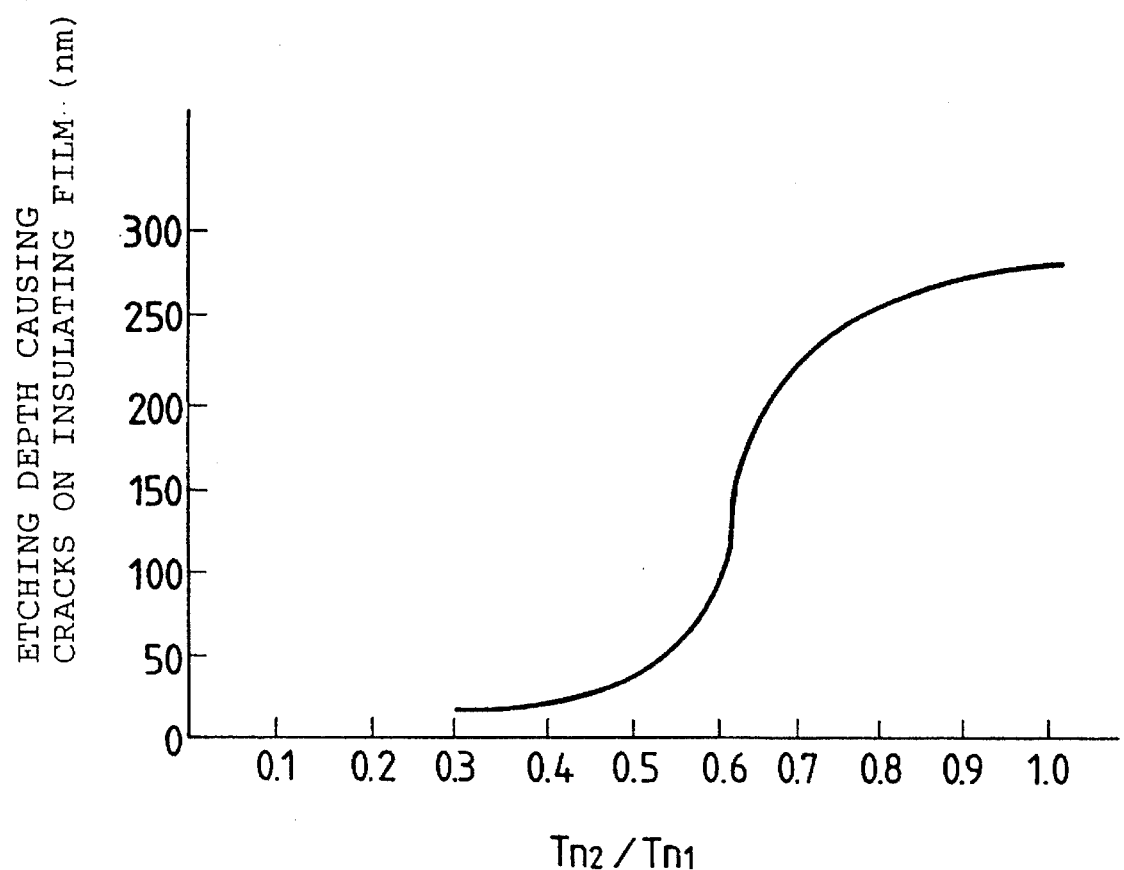
FIG. 4 is a graph showing a relationship between the etching amount leading to cracks in an insulating film and Tn2/Tn1.
Figure 5:
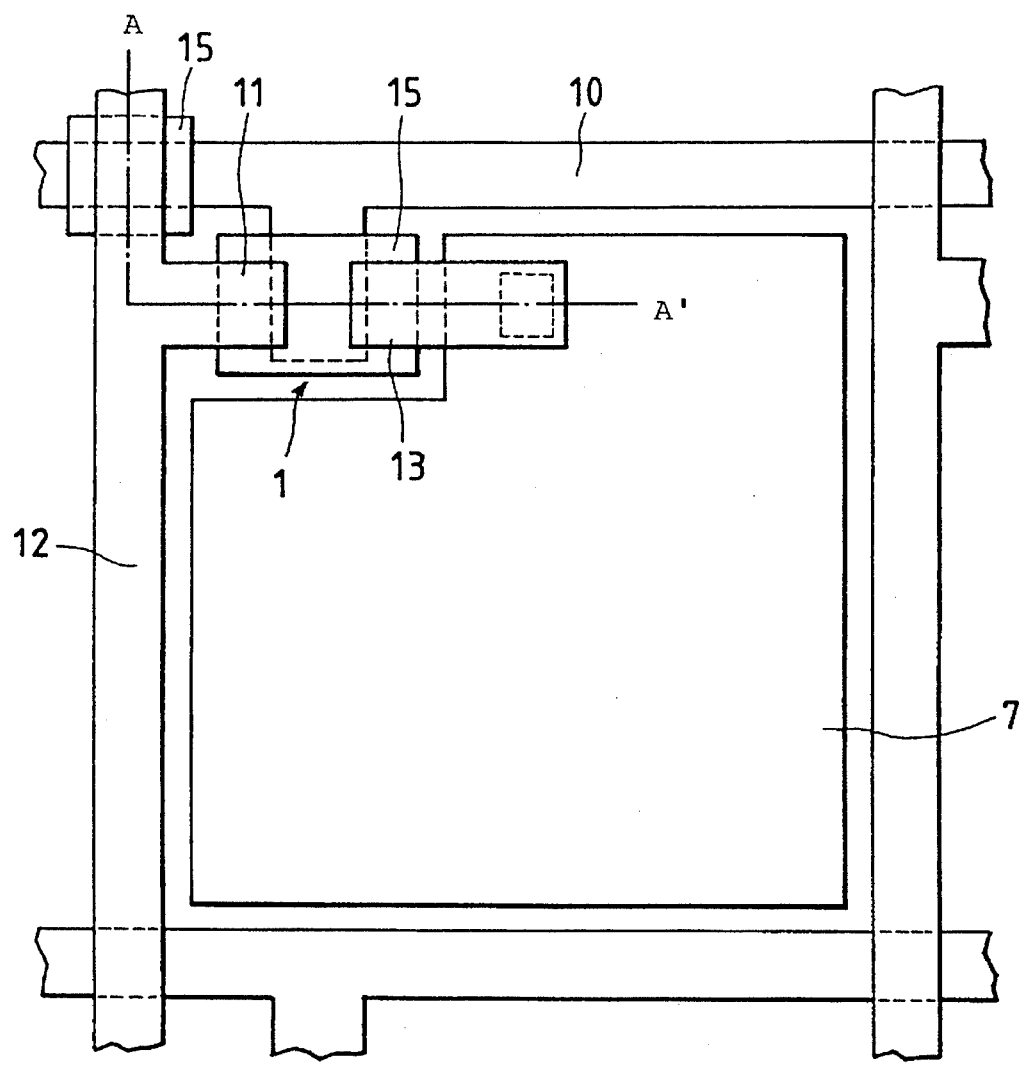
FIG. 5 is a plan view of a conventional TFT.
Figure 6:
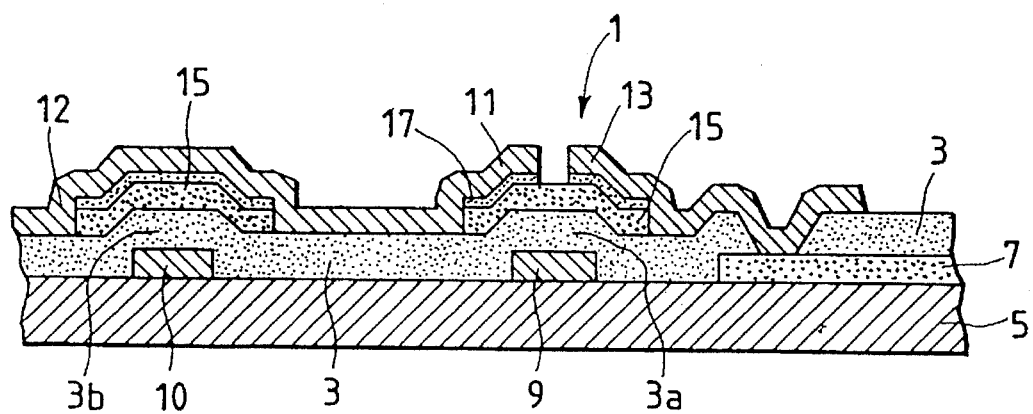
FIG. 6 is a sectional view taken along line A–A' in FIG. 5.

The etching characteristic of each sample was evaluated in the same manner as Embodiment 1. The evaluation results are shown in FIG. 4. As shown in FIG. 4, the etching amount causing cracks on the insulating film rapidly increases and the etching characteristic is enhanced at the point where Tn2/Tn1 exceeds 0.6.

[Embodiment 3]

In this embodiment, the influence of θ was examined.

The value of θ was changed to 0°, 60°, 90° and 100°. θ equals 0° in a case in which a Cr film is deposited on a substrate and an insulating film is laid on the Cr film without patterning. θ equals 100° when the step is inversely tapered.

As a film forming condition in PECV-D, Condition No. 3 in Table 1 was used. In this embodiment, the thicknesses of the Cr film and the insulating film were respectively 100 nm and 200 mn.

The result of the above examination is shown in Table 2. Tn2/Tn1 was approximately 0.6.

TABLE 2

| θ | Break-down voltage (V) |
| --- | --- |
| 0° | 104 |
| 60° | 100 |
| 90° | 98 |
| 100° | 95 |

As shown in Table 2, a surprising result was obtained that the dielectric voltage in the case of θ of 60° can be almost the same as that when the insulating film was formed on the flat Cr film (θ=0°).

[Embodiment 4]

In this embodiment, the relationship between the thickness ratio of the wiring pattern to the insulating film in thickness and the break-down voltage was examined.

The film forming condition No. 3 in Table 1 was adopted.

The result of the examination is shown in Table 3.

TABLE 3

| Thickness of Cr film (nm) | Thickness of Insulating film (nm) | $T_{n1}/T_g$ | Break-down Voltage (V) |
| --- | --- | --- | --- |
| 300 | 300 | 1 | 32 |
| 200 | 300 | 1.5 | 45 |
| 150 | 300 | 2 | 143 |
| 100 | 300 | 3 | 153 |
| 75 | 300 | 4 | 165 |
| 60 | 300 | 5 | 168 |

Table 3 reveals that the break-down voltage increases rapidly when Tn1/Tg exceeds 2 and that the increase of the break-down voltage tends to be brought to saturation when Tn1/Tg exceeds 4.

[Embodiment 5]

In this embodiment, the thickness of the insulating film was examined.

An experiment was conducted while changing the thicknesses of the Cr film and the insulating film as shown in Table 4 so that Tn1/Tg was approximately 2.5. The film depositing condition No. 3 in Table 1 was used for the experiment. Tn2/Tn1 was approximately 0.65.

TABLE 4

| Thickness of Cr film (nm) | Thickness of Insulating film (nm) | $T_{n1}/T_g$ | Break-down Voltage (V) |
| --- | --- | --- | --- |
| 35 | 80 | 2.3 | 41 |
| 40 | 100 | 2.5 | 51 |

TABLE 4-continued

| Thickness of Cr film (nm) | Thickness of Insulating film (nm) | $T_{n1}/T_g$ | Break-down Voltage (V) |
| --- | --- | --- | --- |
| 80 | 200 | 2.5 | 102 |
| 125 | 300 | 2.4 | 148 |
| 150 | 400 | 2.7 | 202 |
| 200 | 500 | 2.5 | 252 |

As shown in Table 4, even a thin insulating film having a thickness of 200 nm has a break-down voltage of more than 100 V in this embodiment, and this is extremely effective in miniaturizing an electronic device. Furthermore, thinning of the gate insulating film can achieve a quick-response device.

[Embodiment 6]

Figure 8A:
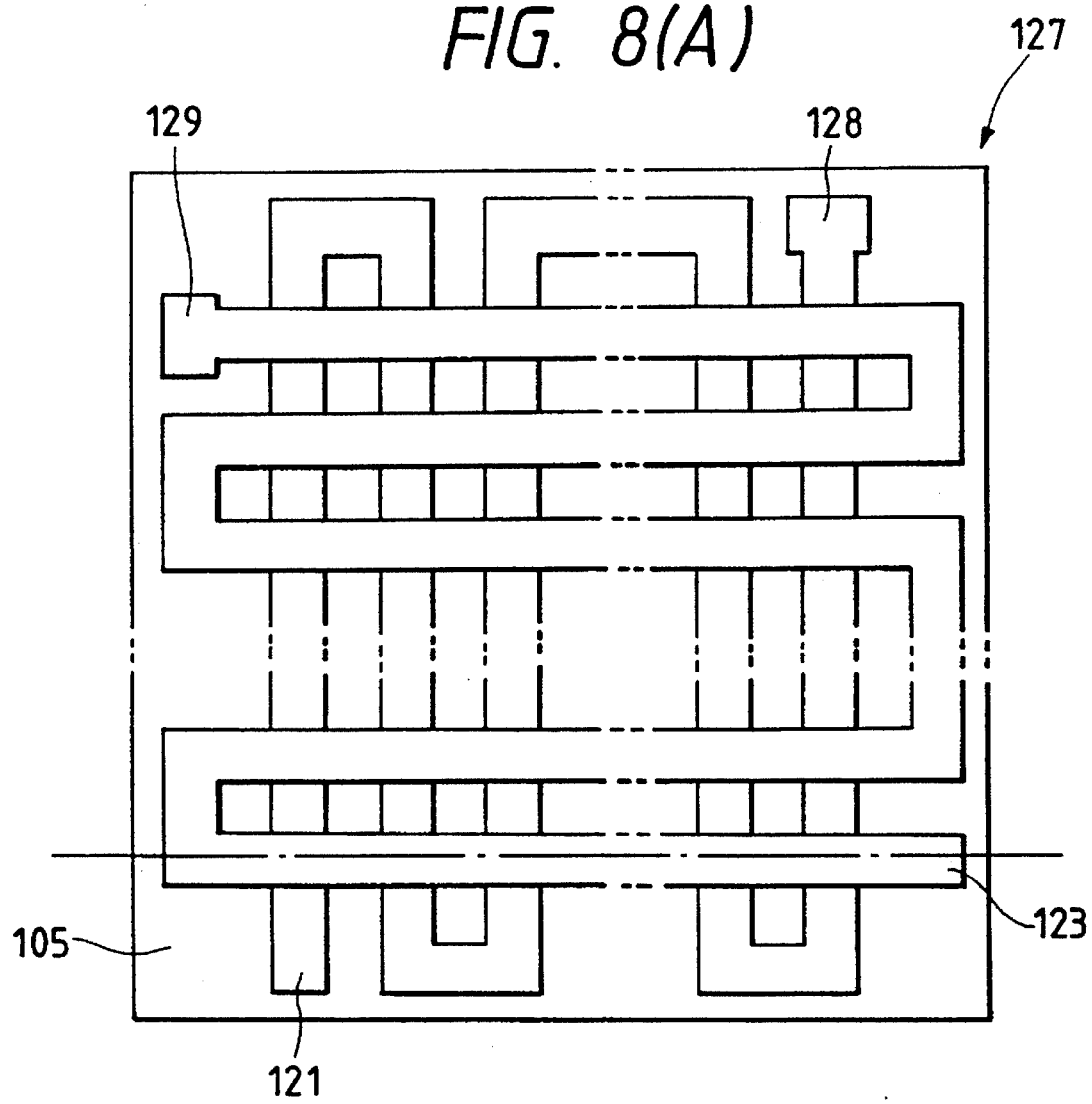
FIG. 8(A) is a schematic plan view of a capacitative element in the embodiments of the present invention.
Figure 8B:
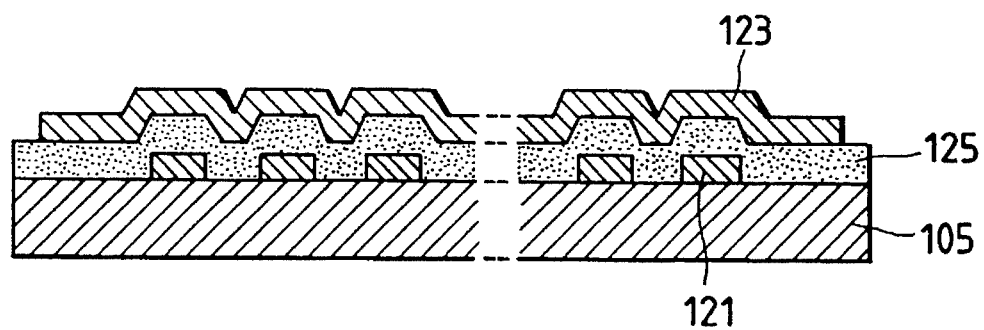
FIG. 8(B) is a sectional view taken along an alternate long and short dash line in FIG. 8(A)

An embodiment in which the present invention is applied to a capacitative element will be described with reference to FIG. 8. FIG. 8(A) is a schematic plan view of a capacitative element 127, and FIG. 8(B) is a schematic sectional view taken along an alternate long and short dash line in FIG. 8(A). In the capacitative element 127, a lower wiring terminal 128 and a lower wire 121 thereto, and an upper wiring terminal 129 and an upper wire 123 thereto are formed through an insulating film 125 on a substrate 105 of 1 cm in length and breadth. The lower wire 121 and the upper wire 123 intersect at 100 points (10 lines×10 rows), and each of the wires is made of Cr and has a thickness of 0.1 μm and a width of 7 μm. The insulating film 125 was deposited in the PECV-D method described in detail below, and the thickness thereof was 0.2 μm.

A silicon nitride thin film used as the insulating film 125 mainly contains silicon and nitrogen at a ratio of approximately 3:4, and has an argon content of 0 atm % (conventional insulating film) to more than 3 atm %. The quantitative analysis of argon was carried out by SIMS6600 from Perkin Elmer. In this capacitative element 127, charges are held at one hundred intersections of the lower wire 121 and the upper wire 123. The break-down voltage between the lower wiring terminal 128 and the upper wiring terminal 129 in the capacitative element 127 was measured by the apparatus #4142B from Hewlett Packard.

The result of the measurement is shown in FIG. 7. Referring to FIG. 7, the vertical axis denotes the break-down voltage, and the horizontal axis denotes the argon content of the insulating film. Though the break-down voltage is generally required to be more than 100 V, as shown in FIG. 7, it was less than 100 V when the argon content of the insulating film 125 in the capacitative element 127 did not exceed 0.01 atm %. On the other hand, even if the argon content exceeded 3 atm %, the break-down voltage was less than 100 V. It was thus confirmed that a preferable argon content was 0.01 atm % to 3 atm %, and more preferably, 1 atm % to 2 atom %.

Figure 11:
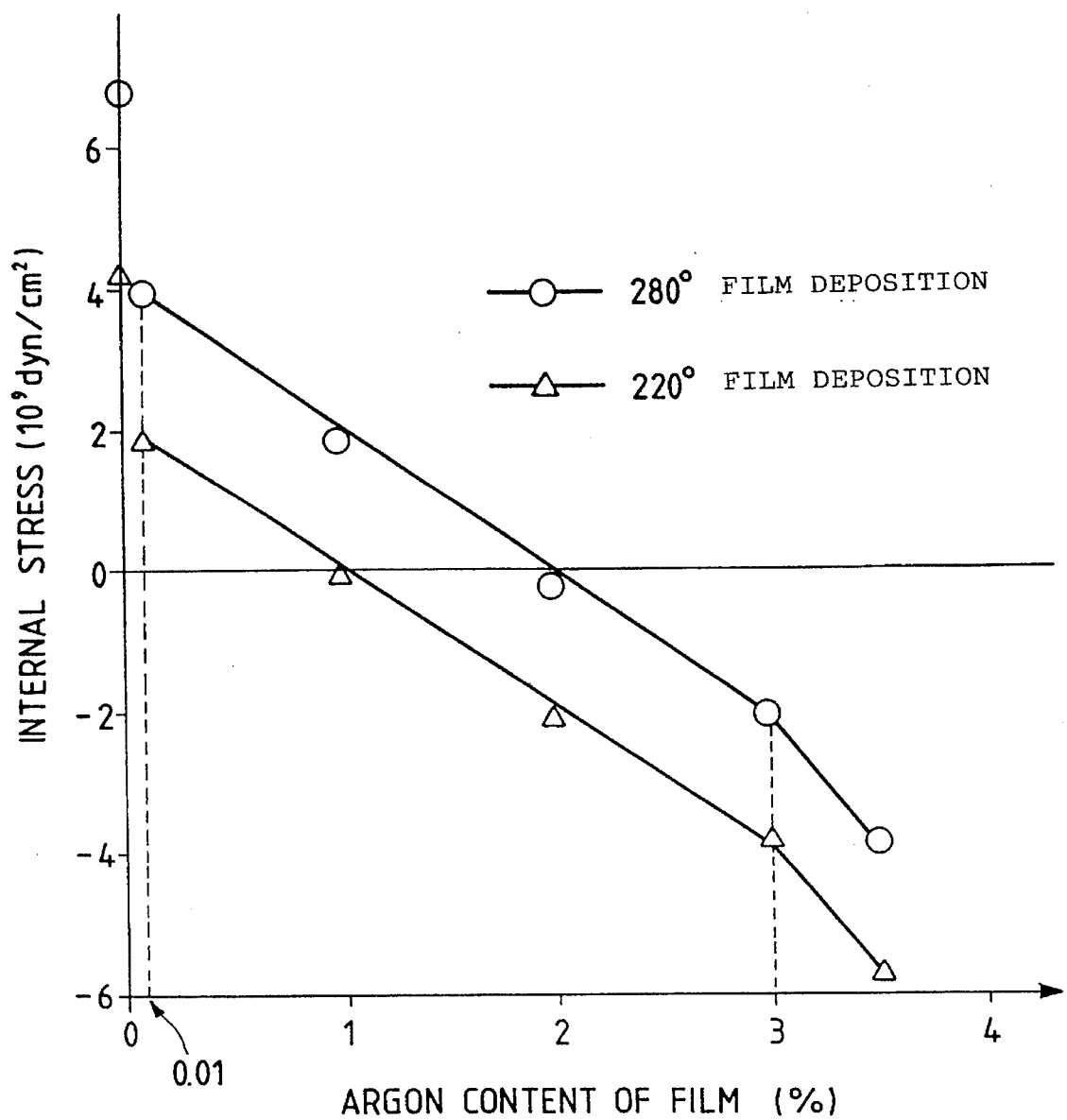
FIG. 11 is a graph showing a relationship between the content of argon and the internal stress of an insulating film used in an electronic device according to the embodiment of the present invention.
Figure 12:
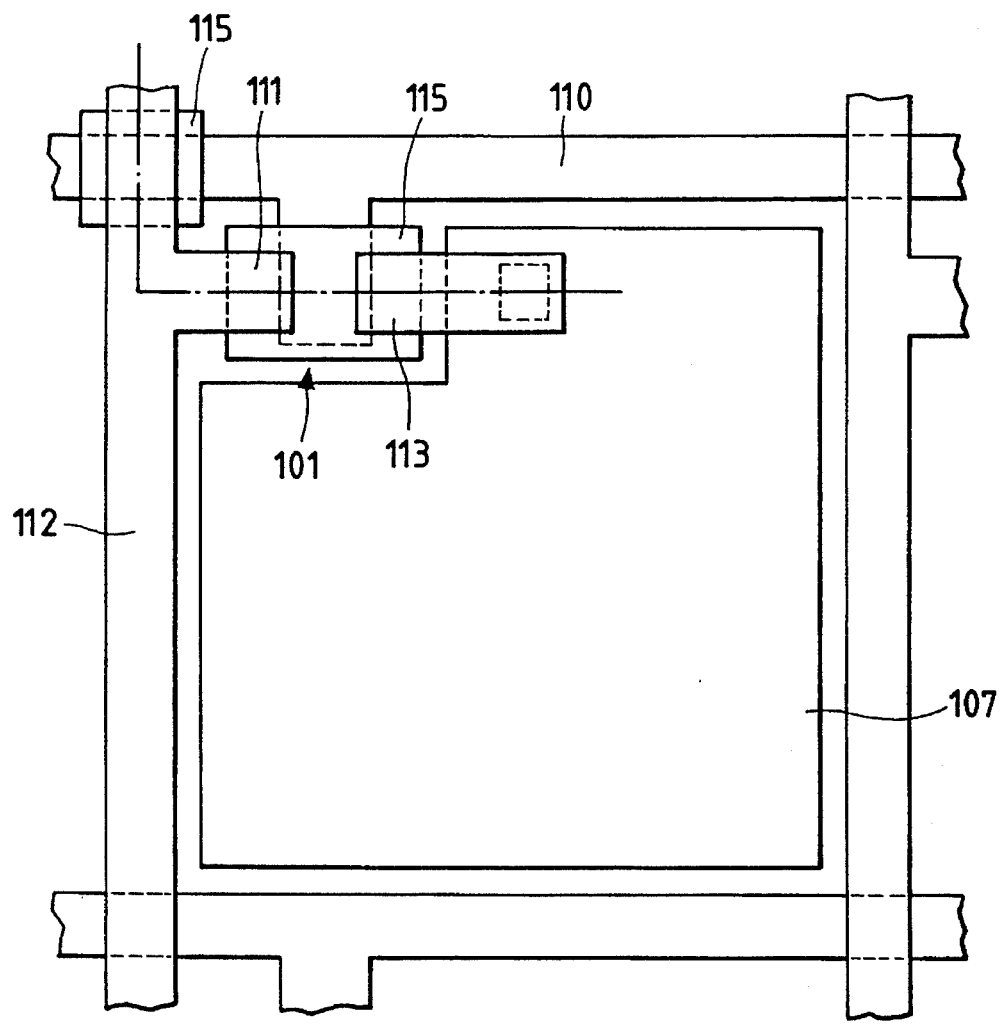
FIG. 12 is a view of a conventional TFT array for an active matrix substrate.
Figure 13:
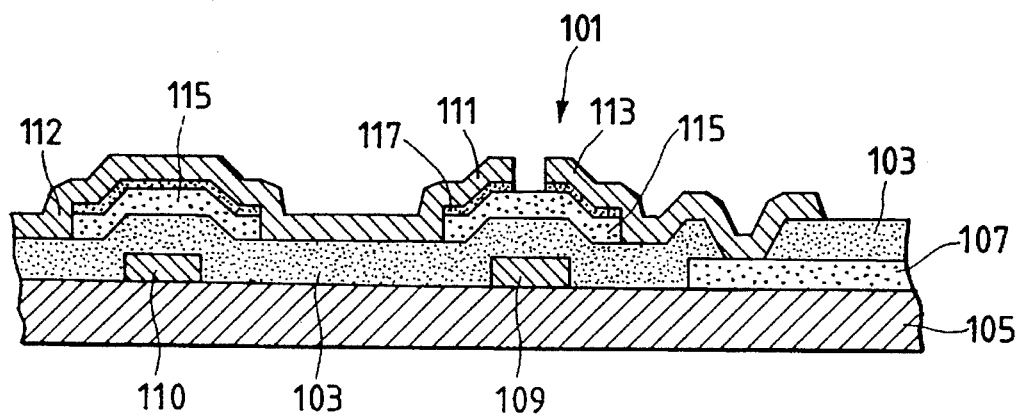
FIG. 13 is a schematic sectional view taken along an alternate long and short dash line in FIG. 12.

The internal stress of the insulating film 125 was measured by a substrate stress measurement apparatus from Flexus. The measurement result is shown in FIG. 11. Referring to FIG. 11, the vertical axis denotes the internal stress and the horizontal axis denotes the argon content of the insulating film 125. In general, it is preferable that an absolute value of the internal stress be small, and the value is required to be within a range of $\pm 4\times 10^9$ dyn/cm². As shown in FIG. 11, when the argon content of the insulating film 125 in the capacitative element 127 did not reach 0.01 atm %, the internal stress exceeded $4\times 10^9$ dyn/cm². To the contrary, even if the argon content exceeded 3 atm %, the internal stress was less than $4\times 10^9$ dyn/cm². It was thus confirmed that a preferable argon content was 0.01 atm % to 3 atm %, and more preferably, 1 atm % to 2 atm %.

As described in detail above, it was confirmed that the capacitative element of the present invention using a silicon nitride film having an argon content ranging from 0.01 atm % to 3 atm % as an insulating film had a sufficient break-down voltage even if the insulating film had a single layer structure.

The method of depositing the insulating film 125 used in this embodiment will be described in detail. The insulating film 125 was deposited by using a parallel plate in-line type film depositing apparatus from Anelva. In the PECV-D method under film depositing conditions Nos. 7 to 12 shown in Table 5.

TABLE 5

| Silicon Nitride Film Forming Conditions | | | | | | |
|---|---|---|---|---|---|---|
| Film Depositing Conditon Injection Gas Condition *1 | No. 7 | No. 8 | No. 9 | No. 10 | No. 11 | No. 12 |
| Silane | 30 | 30 | 30 | 30 | 30 | 30 |
| Ammonia | 60 | 60 | 60 | 60 | 60 | 60 |
| Nitrogen | 1000 | 900 | 750 | 250 | 90 | 0 |
| Argon | 0 | 90 | 250 | 750 | 900 | 1000 |
| Pressure | 100 Pa | | | | | |
| Excitation Frequency | | | 13.56 MHz | | | |
| RF Electric Power | | | 0.11 W/cm$^2$ | | | |
| Film Depositing Temperature | | | 200° C. | | | |

Notes *1
The unit of injection gas is sccm.

The film characteristics of the insulating films 125 formed on the film forming conditions shown in Table 5 are given in Table 6.

TABLE 6

| Film Characteristics According to Film Forming Conditions | | | | | | |
|---|---|---|---|---|---|---|
| Film depositing condition Film element composition silicon: | No. 1 | No. 2 | No. 3 | No. 4 | No. 5 | No. 6 |
| nitrogen | 3:4 | 3:4 | 3:4 | 3:4 | 3:4 | 3:4 |
| argon % | 0 | 0.01 | 1 | 2 | 3 | 3.5 |
| Break-down voltage (V) | 10 | 60 | 175 | 200 | 60 | 10 |
| Internal stress *1 | 4.2 | 2 | 0 | −2 | −3.8 | −5.6 |

Notes *1
A positive value of internal stress expresses a tensile stress, and a negative value of internal stress expresses a compressive stress. The unit of the internal stress is 10$^9$ dyn/cm$^2$.

As shown in Table 6, the main components of the insulating film 125 were silicon and nitrogen under all the conditions, and the element composition ratio thereof was approximately 3:4 as a result of the quantitative analysis by an X-ray photoelectron spectroscopic analyzing apparatus (PH15500 from Perkin Elmer). In a conventional film forming method (Condition No. 7) in which argon gas was not contained in the gas composition, the argon content of the film was 0 atm % as a matter of course, and when a dilution gas (nitrogen+argon) in the gas composition was composed of only an argon gas (Condition No. 12), the argon content was 3.5 atm %. As described above, when the dilution gas was composed of only nitrogen or argon, the break-down voltage was low, 20 V. On the other hand, as in Conditions Nos. 8 to 11, when a value of argon/nitrogen in the dilution gas was within a range of 0.1 (Condition No. 8) to 10 (Condition No. 11), argon of 0.01 atm % to 3 atm % was taken into the insulating film, and a preferable break-down voltage more than 50 V was obtained as shown in FIG. 7. Furthermore, as shown in Conditions Nos. 9 and 10, when the value of argon/nitrogen in the dilution gas was within a range of 0.33 (Condition No. 9) and 3 (Condition No. 10), argon of 1 atm % to 2 atm % was taken into the insulating film, and a more preferable break-down voltage more than 150 V was obtained on each of the conditions.

As shown in Table 6, the internal stress differed according to the film depositing/conditions. When the dilution gas was composed of only nitrogen (Condition No. 7) or argon (Condition No. 12), an absolute value of the internal stress was large, 4.2×10$^9$ dyn/cm$^2$ or −5.6×10$^9$ dyn/cm$^2$. In such device, the internal stress is required to be within a range of ±4×10$^9$ dyn/cm$^2$. On the other hand, as in Conditions Nos. 8 to 11, the value of argon/nitrogen in the dilution gas was within a range of 0.1 (Condition No. 8) to 10 (Condition No. 11), absolute values of the internal stress were small, ranging from 2×10$^9$ dyn/cm$^2$ to −3.8×10$^9$ dyn/cm$^2$ as shown in FIG. 11. Furthermore, as in Condition Nos. 8 to 10, when the value of argon/nitrogen in the dilution gas was within a range of 0.1 (Condition No. 8) to 3 (Condition No. 10), the internal stress was within a range of ±2×10$^9$ dyn/cm$^2$, and a more preferable internal stress characteristic was obtained.

Still furthermore, the insulating film 125 was deposited under the same conditions shown in Table 5 except to change the film depositing temperature to 280° C. As a result, the film element composition and the break-down voltage were the same as those in Table 6, and only the internal stress was shifted to the side of the tensile stress by approximately 2×10$^9$ dyn/cm$^2$. In other words, when the dilution gas was composed of only nitrogen (Condition No. 7) or argon (Condition No. 12), the absolute value of the internal stress was large, 7×10$^9$ dyn/cm$^2$ or −4×10$^9$ dyn/cm$^2$. When the value of argon/nitrogen in the dilution gas was within a range of 0.1 (Condition No. 8) to 10 (condition No. 11) as on Conditions Nos. 8 to 11, the absolute value of the internal stress was small within a range of −4×10$^9$ dyn/cm$^2$ to −2×10$^9$ dyn/cm$^2$ as shown in FIG. 11. Furthermore, as in Conditions Nos. 9 to 11, when the value of argon/nitrogen in the dilution gas was within a range of 1 (Condition No. 9) to 10 (Condition No. 11), the internal stress was within a range of ±2×10$^9$ dyn/cm$^2$.

As described above, the break-down voltage of the insulating film 125 was more than 100 V and the internal stress was within a range of ±4×10$^9$ dyn/cm$^2$ on Conditions Nos. 8 to 11. It was confirmed that a capacitative element using such insulating film was more preferable than one using a conventional insulating film.

On all the conditions of Table 5, the element composition ratio of a material gas (silane+ammonia) was 1:2. Even if the ratio was changed to approximately 1:10, almost the same film characteristics could be obtained.

Furthermore, the flow rate of the dilution gas (nitrogen+argon) was almost ten times that of the material gas (silane+ammonia) in some conditions of Table 5. Even if the amount of the dilution gas was increased to approximately fifty times, an insulating film having the same film characteristics as those in Table 6 could be obtained. It was confirmed that a capacitative element using such insulating film was superior to one using a conventional insulating film.

Still furthermore, though the RF electric power in depositing the insulating film was 0.11 W/cm$^2$ on all the conditions, even if it was increased to 0.4 W/cm$^2$, an insulating film of the same quality as above could be obtained. It was confirmed that a capacitative element using such insulating film was superior to one using a conventional insulating film.

[Embodiment 7]

Figure 9:
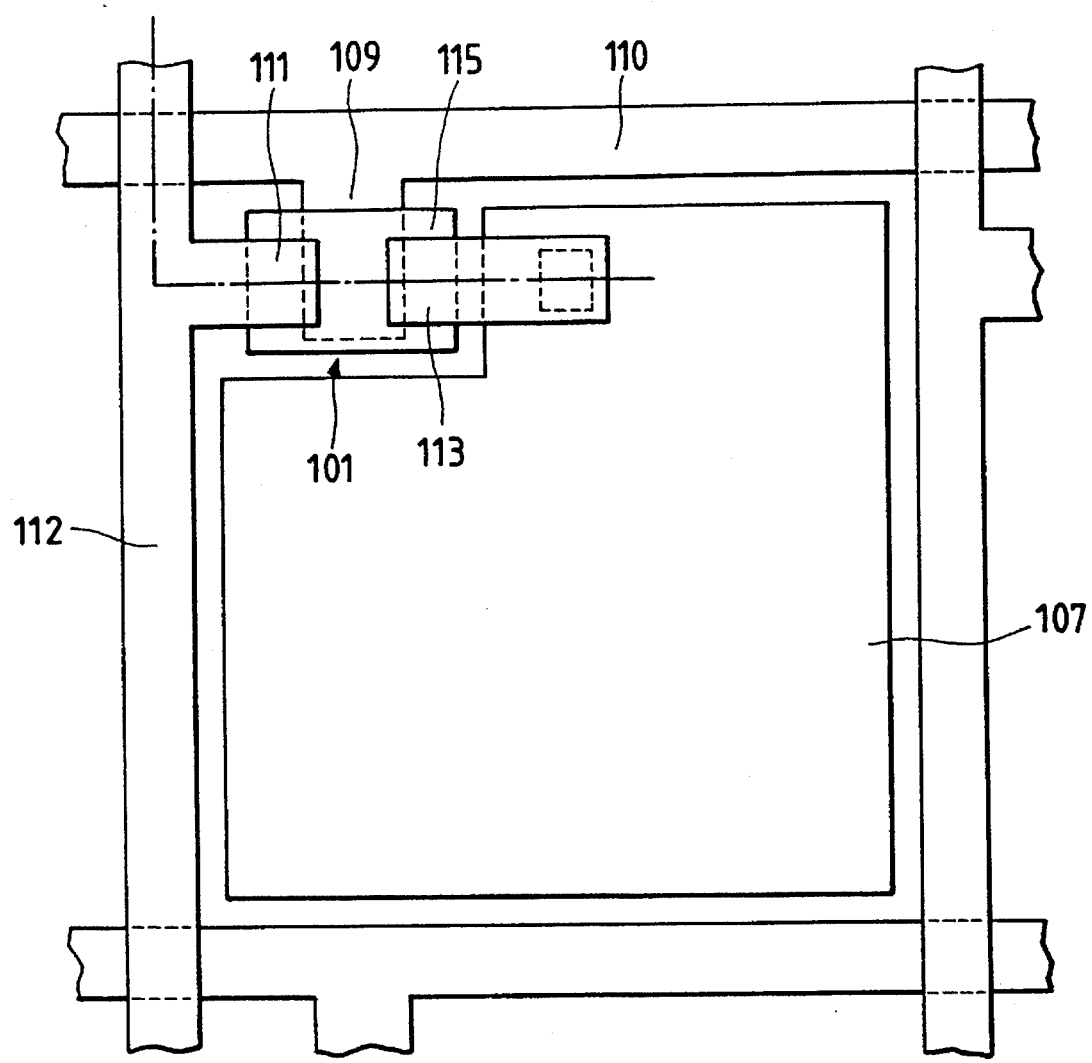
FIG. 9 is a schematic plan view of a part of an active matrix substrate using the TFT according to the embodiment of the present invention.
Figure 10:
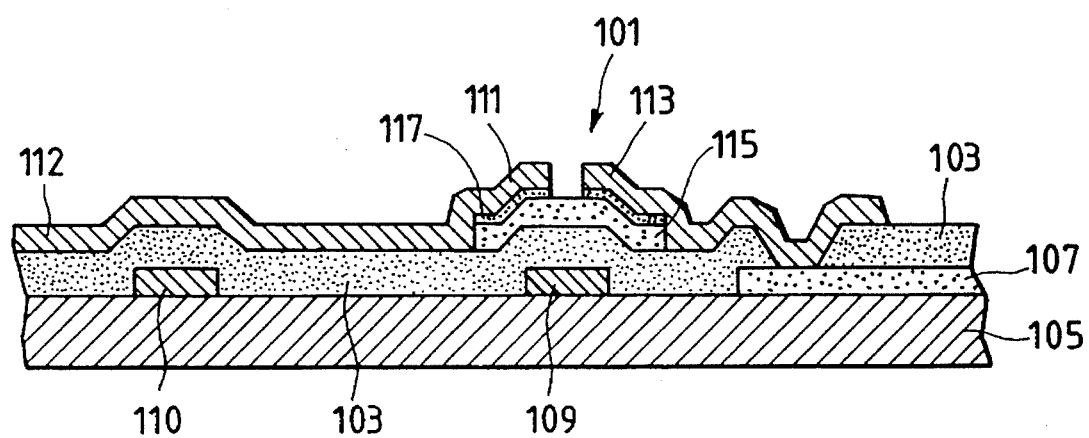
FIG. 10 is a schematic sectional view taken along an alternate long and short dash line in FIG. 9.

FIGS. 9 and 10 each illustrate a part of a substrate in an active matrix liquid crystal display device using a TFT array 101. In this embodiment, the insulating film used in Embodiment 6 is applied to an insulating film 103 at the intersection of multilevel metal wires of the TFT array 101. FIG. 10 is a schematic sectional view taken along an alternate long and short dash line in FIG. 9.

The basic structure of the TFT array electronic device 101 is a well-known inverse stagger structure. A gate wire 110 having a width of 7 μm and a gate electrode 109 connected thereto and having a width of 15 μm, both of which is made of Cr and has a thickness of 0.1 μm, are deposited on a glass substrate (Corning #7059) 105 which is provided with a transparent electrode 107 in a predetermined shape as a pixel electrode on one side thereof. An insulating film 103 having a thickness of 0.2 μm and made of silicon nitride is deposited on the substrate 105 and the gate wire 110. On the surface of the insulating film 103, a semiconductive layer 115 (0.2 μm in thickness) made of amorphous silicon stabilized by hydrogen is laid, and an ohmic contact layer 117 (0.02 μm in thickness) made of amorphous silicon with phosphorus added, a source electrode 111 and a drain electrode 113 are further laid thereon through a channel portion. Both the source electrode 111 and the drain electrode 113 are made of Cr and 12 μm in thickness. A source wire 112 having a width of 7 μm is connected to the source electrode 111 and the transparent 107 is connected to the drain electrode 113 through a contact hole. The channel length and width of the TFT 101 are respectively 7 μm and 12 μm.

In such TFT, the break-down voltage between the gate electrode 110 and the source wire 112 was evaluated in the same manner as Embodiment 6. The break-down voltage characteristic similar to that of the capacitative element shown in FIG. 7 was obtained in accordance with the argon content of the insulating film. It was confirmed that, in a TFT which used a silicon nitride thin film having an argon content ranging from 0.01 atm % to 3 atm % as an insulating film, the insulating film had a sufficient break-down voltage even in a single layer structure. A threshold value, an ON-state current and an OFF-state current of such TFT were the same as those of a conventional TFT using an insulating film made of silicon nitride and containing no argon, and there was no problem in these characteristics.

The method of depositing the insulating film 103 used in this embodiment is the same as that of Embodiment 6. The insulating film 103 was deposited in the PECV-D method under the Conditions Nos. 7 to 12 shown in Table 5 while changing the film depositing temperature, the material gas composition, the flow rate of a dilution gas relative to that of the material gas, and so on as in Embodiment 6. The film characteristics of the obtained insulating film 103 were the same as those shown in Table 6. The main components of the insulating film 103 were silicon and nitrogen on all the conditions, and the composition ratio of silicon to nitrogen was approximately 3:4. The argon content of the film was 0 atm % to 3.5 atm % in accordance with the argon gas content of a dilution gas in the gas composition in film formation. Furthermore, the break-down voltage and internal stress were the same as those in the above Embodiment 6.

As described above, the insulating film 103 was the same as that of Embodiment 6, the break-down voltage thereof was more than 100 V, and the internal stress was within a range of $\pm 4 \times 10^9$ dyn/cm$^2$. It was confirmed that a TFT using such insulating film was superior to a TFT using a conventional insulating film.

[Embodiment 8]

This embodiment is different from Embodiment 7 only in a method of forming an insulating film 125. Sputtering used for the film formation will be specifically described below. The insulating film 125 was deposited in sputtering on film depositing conditions Nos. 13 to 18 shown in Table 7. Table 7 also shows the film characteristics of the deposited insulating film 125.

TABLE 7

Sputtering Film Forming Conditions and Film Characteristics

| Film Depositing Condition | No.13 | No.14 | No.15 | No.16 | No.17 | No.18 |
|---|---|---|---|---|---|---|
| Target | | Silicon | | | Silicon Nitride | |
| Atmospheric gas condition (Pa) | | | | | | |
| Ar | 0.10 | 0.20 –0.40 | 0.50 | 0.10 | 0.20 –0.40 | 0.50 |
| H | 0.02 –0.15 | 0.02 –0.15 | 0.02 –0.15 | 0.02 –0.15 | 0.02 –0.15 | 0.02 –0.15 |
| Total Pressure | 2.0 | | | | | |
| Excitation Frequency | | | 13.56 MHz | | | |
| RF power | | | 35 W/cm$^2$ | | | |
| Temperature | | | 280° C.–320° C. | | | |
| Film element composition | | | | | | |
| Si:N | — | 3:4 | 3:4 | — | 3:4 | 3:4 |
| Ar atm % | — | 0.01 –3 | 5 | — | 0.01 –3 | 5 |
| Break-down Voltage (V) | — | 60 –180 | 10 | — | 60 –150 | 10 |
| Internal stress | — | –2– –3 | –6 | — | –2– –3 | –6 |

Notes
1: A positive value of internal stress expresses a tensile stress, and a negative value of internal stress expresses a compressive stress. The unit of the internal stress is 109 dyn/cm$^2$.
2: When the Ar partial pressure was. 0.1 Pa, hardly any film was formed.

As shown in Table 7, the deposited insulating film was mainly composed of silicon and nitrogen on all the conditions, and the element composition ratio thereof was approximately 3:4 in the same manner as Embodiment 6. When the argon gas partial pressure of the atmospheric gas was 0.10 Pa (Conditions Nos. 13 and 16), plasma was not stabilized regardless of the type of a target, the partial pressure of hydrogen and the film depositing temperature and hardly any film was formed. As the atmospheric gas, a nitrogen gas or an ammonia gas was also used (nitrogen was taken into the film as a reaction gas on Conditions Nos. 13 to 15 using silicon nitride as a target). On the other hand, as the argon gas partial pressure in the atmospheric gas composition increased to 0.20 Pa to 0.40 Pa (Conditions Nos. 14 and 17), the plasma was stabilized and a stable film deposition was carried out. The argon content of the film was increased to 0.01 atm % to 3 atm %. In a conventional film deposition by using an atmospheric gas containing argon gas of 0.50 Pa (Conditions Nos. 15 and 18), the argon content of a deposited film was 5 atm %.

The break-down voltage and the internal stress of the deposited silicon nitride thin film were good on Conditions Nos. 14 and 17 as shown in Table 7, and the film characteristics thereof were so sufficient that the thin film could be used as an insulating film of a TFT. On the other hand, in the conventional sputtering method using a large quantity of argon gas (Conditions Nos. 15 and 18), the break-down voltage was approximately 20 V and the internal stress was approximately $-6 \times 10^9$ dyn/cm$^2$, which are insufficient to use the film as an insulating film of a TFT.

As described above, the break-down voltage of the insulating film 125 was more than 100 V and the internal stress thereof was within a range of $\pm 4 \times 10^9$ dyn/cm$^2$ on Conditions Nos. 14 and 17. It was confirmed that a TFT using this insulating film was superior to one using a conventional insulating film.

The partial pressure of hydrogen in the atmospheric gas composition of this embodiment was 0.02 Pa to 0.15 Pa, and almost the same film characteristics could be obtained in this range. It can be thought that hydrogen contributes to termination of dangling bonds. Though the total pressure was 2.0 Pa in Table 7, if it was approximately 1.0 Pa to 7.0 Pa, the same film characteristics could be obtained. According to this embodiment, since a silicon crystal and a sintered compound of silicon nitride were used as targets, it was unnecessary to use a silane gas which is dangerous and therefore required to be treated carefully.

[Embodiment 9]

This embodiment is different from Embodiment 6 in ion implantation for depositing the insulating film 125. The ion implantation method used in the film deposition will now be described in detail.

Argon was doped into an insulating film deposited on the above-mentioned Condition No. 7 by ion implantation. The doping of argon was conducted by using an apparatus from Varian and having a hot-cathode discharge ion source. The acceleration voltage was 150 kV and the ion current was 800 μA. The argon contents of films obtained in various processing times were measured by SIMS6600 from Perkin Elmer in the similar manner as above. As a result of the measurement, when the argon content was within a range of 0.01 atm % to 3 atm %, a sufficient break-down voltage more than 100 V was obtained the same as in Table 6.

As described above, it was confirmed that a capacitative element described in this embodiment using a silicon nitride thin film having an argon content ranging from 0.01 atm % to 3 atm % as an insulating film had a sufficient break-down voltage even if the film had a single layer structure.

As specifically described above, the insulating film of silicon nitride could be a film having a good break-down voltage by containing argon of 0.01 atm % to 3 atm % regardless of the type of the insulating film depositing method, for example, PECV-D, sputtering or ion implantation. Therefore, a sufficient break-down voltage was obtained in an electronic device using such insulating film even if the insulating film had a single layer structure.

[Embodiment 10]

Figure 14:
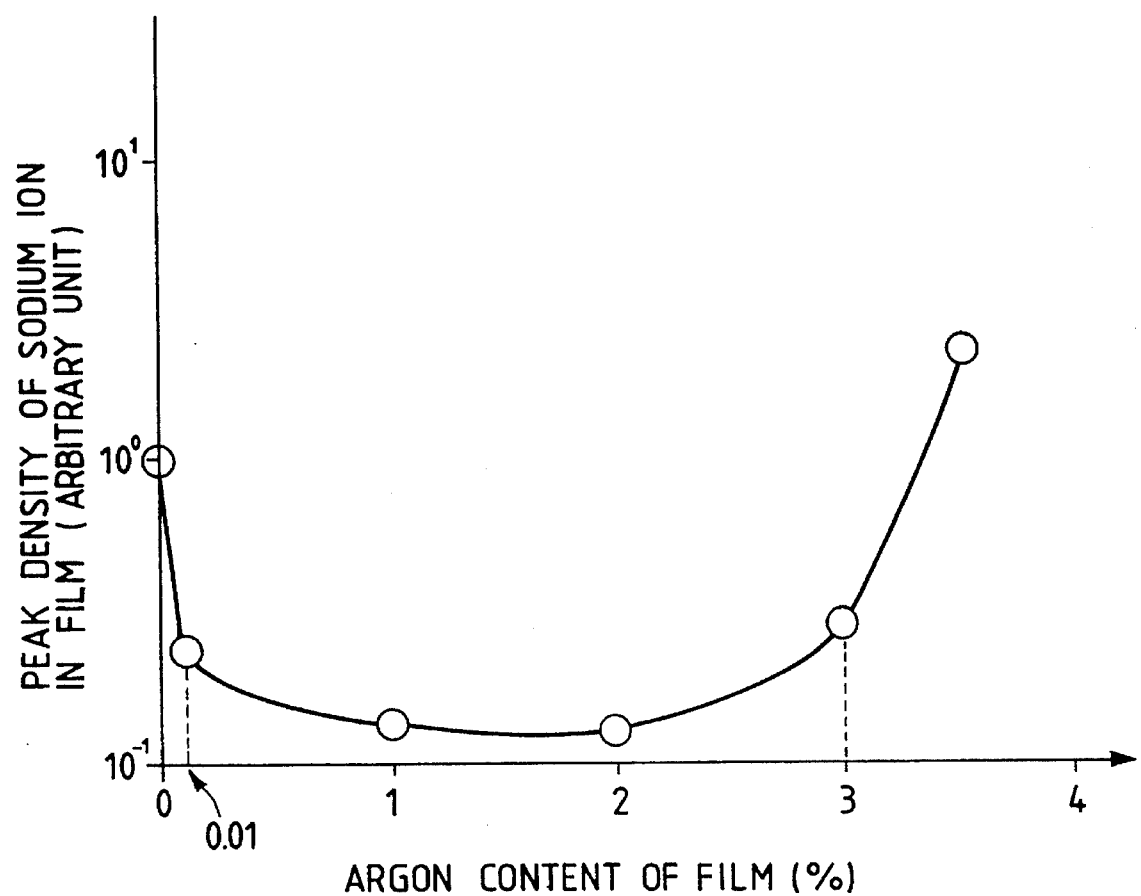
FIG. 14 is a graph showing a relationship between the content of argon and the peak density of sodium ions in the film.

In this embodiment, an electronic device to which the present invention is applied is a MOS transistor. As a passivation film of the MOS transistor, the insulating film of silicon nitride deposited in the film formation method shown in Table 5 was used. Various kinds of characteristics of the MOS transistor were also stable in this embodiment. Among these characteristics, permeability of sodium ions sensitively depending upon the characteristics of the passivation film will be described in detail with reference to FIG. 14. FIG. 14 shows the relationship between the argon content of the passivation film and the peak density of sodium ions permeating through the passivation film. A permeation test of the sodium ions was conducted by heating a MOS transistor as a sample in the atmosphere of general room air to 550° C. for twenty hours. The peak density of the sodium ions was measured by using the above-mentioned apparatus SIMS6600 from Perkin Elmer while sputtering the passivation film in the direction of the depth thereof.

As shown in FIG. 14, it was confirmed that the permeation amount of the sodium ions was very small when the argon content of the passivation film in the MOS transistor was 0.01 atm % to 3 atm %. This result revealed that the passivation film having an argon content ranging from 0.01 atm % to 3 atm % was a considerably dense film. The break-down voltage of the MOS transistor was good as expected from the result in the above Table 6.

Though the rare gas element is argon in this embodiment, the present invention is not limited to this embodiment and helium, neon, krypton or xenon is also effective as a rare gas element. Since argon is less expensive and more easy to get stably than other elements, the use of argon is industrially optimal.

[Embodiment 11]

In this embodiment, an insulating film 103, a semiconductive layer 115 made of amorphous silicon and an ohmic contact layer 117 made of amorphous silicon with phosphorus in a TFT array electronic device similar to that of Embodiment 7 were deposited at 250° C. Other film forming conditions of the insulating film 103 were the same as those in Table 5, and other conditions were the same as those of Embodiment 7.

Figure 16:
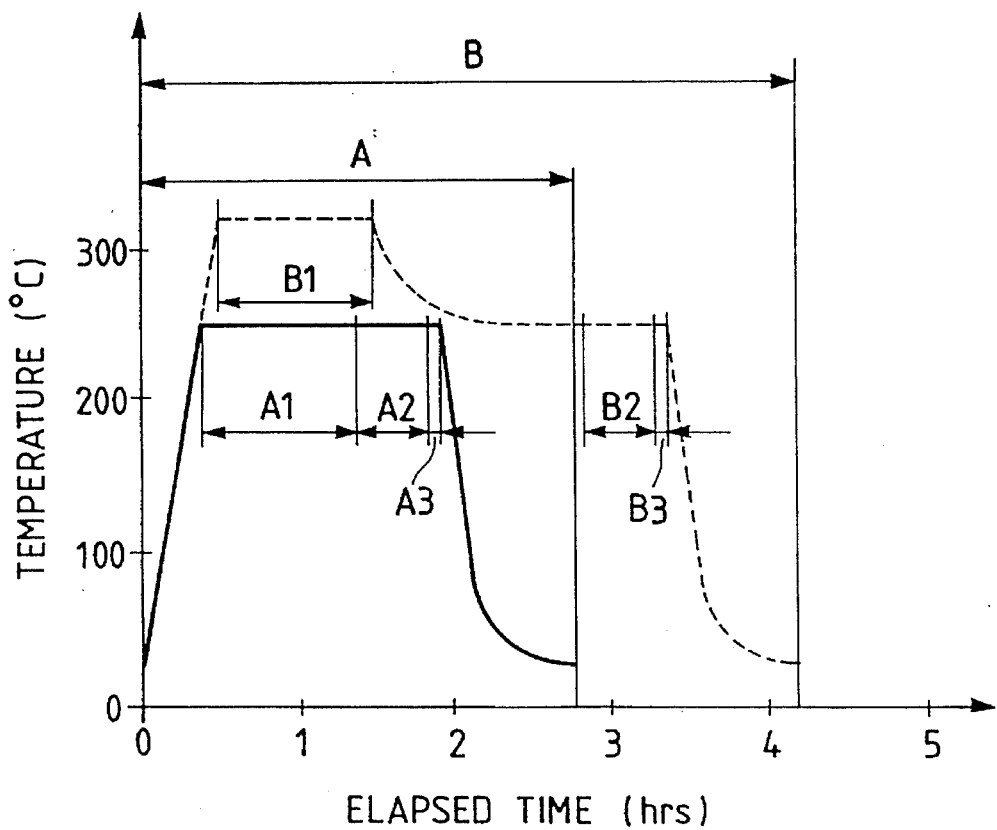
FIG. 16 is a view showing the temperature profiles of three-layered films in the embodiment and a compared example.

The temperature profile in depositing the insulating film 103, the semiconductive layer 115 and the ohmic contact layer 117 is expressed in a solid line of FIG. 16. As a compared sample, the temperature profile in depositing the insulating film 103 at 320° C., which is a general film depositing temperature for depositing an insulating film in the conventional PECV-D method without any rare gas element and then depositing the semiconductive layer 115 and the ohmic contact layer 117 at 250° C., is expressed in a broken line of FIG. 16.

Referring to FIG. 16, A and B respectively denote the time taken to put a substrate into a film depositing apparatus, form the above three layers and take the substrate out in this embodiment and the compared example. A1 and B1 each denote the time (one hour) taken to deposit the insulating film 103, A2 and B2 each denote the time (thirty minutes) taken deposit the semiconductive layer 115, and A3 and B3 each denote the time (ten minutes) taken to deposit the ohmic contact layer 117. These times are the same between this embodiment and the compared example. Though both this embodiment and the compared example take one hour and forty minutes to deposit the three layers, they are different in the time since the substrate was putted in and until it was taken out. This is because the time for controlling the temperature differs much between this embodiment and the compared example.

Though thirty minutes were taken to reach the insulating film depositing temperature in the compared example, approximately twenty minutes were taken in this embodiment. Furthermore, though it took one hour and a half in the compared example to lower the temperature to 250° C. for depositing the semiconductive layer of amorphous silicon, since the temperature for depositing the semiconductive layer was the same as the insulating film depositing temperature in this embodiment, the deposition of the semiconductive layer could be started immediately after depositing the insulating film. Consequently, the compared example took four and a half hours to put the substrate in, deposit all the layers, cool the substrate to the room temperature and take the substrate out, while this embodiment took two hours and fifty minutes, one hour and forty minutes (approximately 30%) shorter than the compared example. In this embodiment, the time taken deposit the films was greatly shortened. Additionally, since an apparatus for depositing the films did not need a special mechanism for adjusting the temperature after depositing the insulating film, the apparatus could be made compact and the mount area of the apparatus in a clean room was small, thereby increasing economy.

[Embodiment 12]

In this embodiment, an insulating film 103 and a semiconductive layer 115 made of amorphous silicon were deposited in the same manner as the above Embodiment 11 at 320° C., 300° C., 280° C., 250° C. and 220° C. Other film depositing conditions of the insulating film 103 were the same as those of Condition No. 9 in Table 5 and other conditions were the same as those of Embodiment 7.

Figure 15:
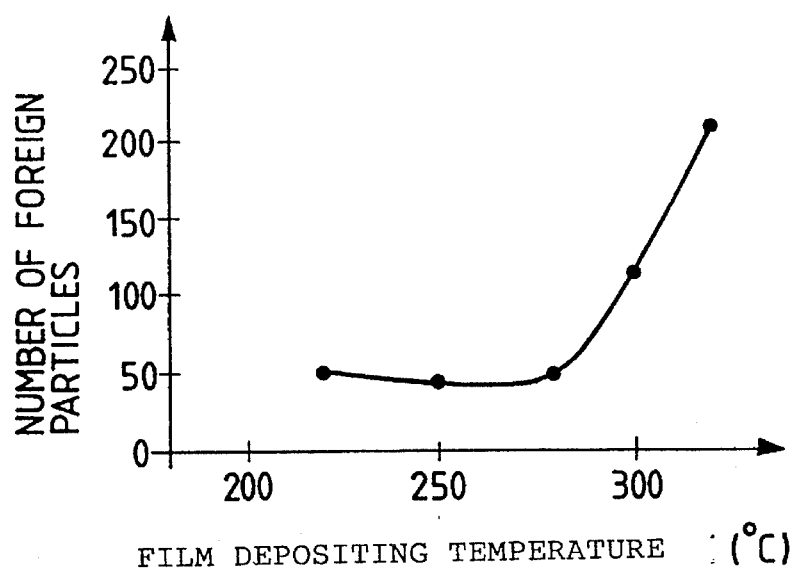
FIG. 15 is a graph showing a relationship between the film depositing temperature and the number of foreign particles.

The number of foreign particles in the thus deposited semiconductive layer 115 made of amorphous silicon was measured. The result of the measurement is shown in FIG. 15. The horizontal axis denotes the continuous film depositing temperature of the above two layers, and the vertical axis denotes the number of foreign particles found on the surfaces of one hundred substrates formed on the same condition and each having an area of 1 cm$^2$. As shown in FIG. 15, the lower the film depositing temperature was, the smaller the number of foreign particles was. Particularly, when the film depositing temperature was less than 280° C., such tendency was noticeable.

As described above, in an electronic device according to the present invention, since the break-down voltage of an insulating film is high, the necessity break-down voltage can be obtained even if the insulating film has a single layer structure. Therefore, in the production of the electronic device, the trouble of depositing the insulating film in a multilayered structure can be saved. This is also effective in a TFT.

According to an electronic device producing method of the present invention, since the break-down voltage of an insulating film in an obtained electronic device is high, the necessity break-down voltage can be obtained even if the insulating film has a single layer structure. Therefore, the trouble of depositing the insulating film in a multilayered structure is saved, and the electronic device can be produced in a simple process.

Furthermore, according to the electronic device producing method which obtains an insulating film in sputtering, it is unnecessary to use a dangerous silane gas which is required to be treated carefully, in depositing the insulating film.

The use of argon as a rare gas element makes it possible to carry out the present invention stably and economically.

Furthermore, since the temperature of depositing the insulating film can be lowered, the generation of foreign particles in film deposition is restricted, thereby achieving a high-quality film containing no foreign particles.

Still furthermore, according to the electronic device producing method of the present invention, since the insulating film can be deposited at the same temperature as the semiconductive layer made of amorphous silicon, the time needed to deposit these films can be greatly shortened, and a film depositing apparatus can be made compact. Therefore, the apparatus is inexpensive and a clean room, which is an expensive environment, can be effectively utilized.

I claim:

1. An electronic device producing method for forming an electronic device provided with a conductive wiring pattern formed on a surface of a substrate, at least said surface being electrically insulated, and an insulating film mainly composed of silicon and nitrogen and deposited to cover said substrate and said wiring pattern partly or wholly, wherein a target for depositing said insulating film in sputtering includes at least silicon, an atmospheric gas for the sputtering is a mixture of at least a rare element gas, a hydrogen gas, and a nitrogen gas or an ammonia gas, the partial pressures of said rare gas element gas and said hydrogen gas are respectively 0.20 Pa to 0.40 Pa and 0.02 Pa to 0.15 Pa.

2. An electronic device producing method according to claim 1, wherein said rare gas element is argon.

* * * * *